US011257429B2

United States Patent
Jeong

(10) Patent No.: US 11,257,429 B2
(45) Date of Patent: Feb. 22, 2022

(54) PIXEL CIRCUIT

(71) Applicant: Samsung Display Co., Ltd., Yongin-si (KR)

(72) Inventor: Young-Cheol Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/734,364

(22) Filed: Jan. 5, 2020

(65) Prior Publication Data

US 2020/0234641 A1 Jul. 23, 2020

(30) Foreign Application Priority Data

Jan. 17, 2019 (KR) ........................ 10-2019-0006112

(51) Int. Cl.
| | | |
|---|---|---|
| *G09G 3/3233* | (2016.01) | |
| *H01L 27/32* | (2006.01) | |
| *G09G 3/3208* | (2016.01) | |
| *G09G 3/3266* | (2016.01) | |

(52) U.S. Cl.
CPC ....... *G09G 3/3233* (2013.01); *H01L 27/3265* (2013.01); *H01L 27/3276* (2013.01); *G09G 2300/0439* (2013.01)

(58) Field of Classification Search
CPC .. G09G 3/3233; G09G 3/3208; G09G 3/3266; G09G 2300/0861; G09G 2300/0819; G09G 2300/0426; H01L 27/3276; H01L 27/3265
See application file for complete search history.

(56) References Cited

U.S. PATENT DOCUMENTS

| | | | |
|---|---|---|---|
| 8,395,157 B2 | 3/2013 | Park et al. | |
| 9,768,310 B2 | 9/2017 | Ahn et al. | |
| 2003/0030381 A1* | 2/2003 | Yamazaki | ........... H01L 27/3276 315/169.1 |
| 2006/0061526 A1* | 3/2006 | Shirasaki | ............. G09G 3/3233 345/77 |

(Continued)

FOREIGN PATENT DOCUMENTS

KR 10-2018-0049325 5/2018

*Primary Examiner* — David Tung
(74) *Attorney, Agent, or Firm* — H.C. Park & Associates, PLC

(57) ABSTRACT

A pixel circuit including an organic light-emitting element, a switching transistor, a storage capacitor that stores a data signal applied via a data line, a driving transistor that allows a driving current corresponding to the data signal to flow into the organic light-emitting element, an emission control transistor electrically connected to the organic light-emitting element and the driving transistor in series, and sync transistors electrically connected to a bottom metal electrode of the driving transistor. The sync transistors include a first sync transistor electrically connected to a first one selected from a source electrode of the driving transistor, a gate electrode of the driving transistor, the high power voltage, and the low power voltage and a second sync transistor electrically connected to a second one selected from the source electrode of the driving transistor, the gate electrode of the driving transistor, the high power voltage, and the low power voltage.

7 Claims, 12 Drawing Sheets

(56) References Cited

U.S. PATENT DOCUMENTS

| | | | | |
|---|---|---|---|---|
| 2007/0290227 | A1* | 12/2007 | Liang | H01L 29/78648 257/151 |
| 2010/0053041 | A1* | 3/2010 | Abe | G09G 3/325 345/76 |
| 2010/0220118 | A1* | 9/2010 | Kanegae | G09G 3/3233 345/690 |
| 2011/0273419 | A1* | 11/2011 | Park | H01L 27/3276 345/211 |
| 2012/0327058 | A1* | 12/2012 | Minami | G09G 3/3225 345/211 |
| 2013/0069068 | A1* | 3/2013 | Miyake | H01L 27/0629 257/59 |
| 2015/0171156 | A1* | 6/2015 | Miyake | H01L 27/1255 257/43 |
| 2015/0187276 | A1* | 7/2015 | Shim | G09G 3/3291 345/77 |
| 2015/0235592 | A1* | 8/2015 | Yamashita | H01L 27/3276 345/206 |
| 2016/0042694 | A1* | 2/2016 | Lim | G09G 3/3233 345/78 |
| 2016/0300900 | A1* | 10/2016 | Miyake | G09G 3/3258 |
| 2016/0329392 | A1* | 11/2016 | Miyake | H01L 27/124 |
| 2018/0102397 | A1* | 4/2018 | Nie | H01L 27/3265 |
| 2018/0144685 | A1* | 5/2018 | Gong | H01L 27/3262 |

* cited by examiner

PIXEL CIRCUIT

CROSS-REFERENCE TO RELATED APPLICATION

This application claims priority from and the benefit of Korean Patent Application No. 10-2019-0006112, filed on Jan. 17, 2019, which is hereby incorporated by reference for all purposes as if fully set forth herein.

BACKGROUND

Field

Exemplary embodiments of the invention relate generally to an organic light-emitting display device. More particularly, exemplary embodiments of the invention relate to a pixel circuit that includes an organic light-emitting element (e.g., an organic light-emitting diode), a switching transistor, a storage capacitor, an emission control transistor, a driving transistor, etc.

DISCUSSION OF THE BACKGROUND

Generally, a pixel circuit included in an organic light-emitting display device includes an organic light-emitting element, a switching transistor, a storage capacitor, an emission control transistor, a driving transistor, etc. Recently, a "back-biasing" technology (also referred to as a "sync" technology) that forms a bottom metal layer (BML) under a thin film transistor (e.g., an oxide thin film transistor, etc.) included in the pixel circuit, where the bottom metal layer may be referred to as a bottom metal electrode of the thin film transistor, and shifts (or moves) a threshold voltage of the thin film transistor in a positive direction or in a negative direction by applying a back-biasing voltage to the bottom metal electrode of the thin film transistor when the pixel circuit is driven, has been suggested. However, because a conventional back-biasing technology determines (or fixes) a purpose of applying the back-biasing voltage to the bottom metal electrode of the thin film transistor in a design stage of the pixel circuit (e.g., applying the back-biasing voltage to the bottom metal electrode of the driving transistor in order to reduce (or improve) an instantaneous after-image of the organic light-emitting display device, applying the back-biasing voltage to the bottom metal electrode of the driving transistor in order to increase (or improve) emission luminance of the organic light-emitting display device, etc.), a direction in which the threshold voltage of the thin film transistor (e.g., the driving transistor) is shifted may also be determined in one direction in the designing stage of the pixel circuit. Thus, the conventional back-biasing technology cannot selectively shift the threshold voltage of the driving transistor in a positive direction or in a negative direction according to operating phases (e.g., an initializing phase, a threshold voltage compensating phase, a data writing phase, an light-emitting phase, etc.) and/or operating conditions of the organic light-emitting display device.

The above information disclosed in this Background section is only for understanding of the background of the inventive concepts, and, therefore, it may contain information that does not constitute prior art.

SUMMARY

Exemplary embodiments of the invention provide a pixel circuit having a structure in which a threshold voltage of a driving transistor can be selectively shifted in a positive direction or in a negative direction according to operating phases and/or operating conditions of an organic light-emitting display device.

Additional features of the inventive concepts will be set forth in the description which follows, and in part will be apparent from the description, or may be learned by practice of the inventive concepts.

An exemplary embodiment of the invention provides a pixel circuit including an organic light-emitting element, a switching transistor configured to be turned on or off in response to a scan signal, a storage capacitor configured to store a data signal applied via a data line when the switching transistor is turned on in response to the scan signal, a driving transistor configured to allow a driving current corresponding to the data signal stored in the storage capacitor to flow into the organic light-emitting element, an emission control transistor electrically connected to the organic light-emitting element and the driving transistor in series between a high power voltage and a low power voltage and configured to be turned on or off in response to an emission control signal, and a plurality of sync transistors electrically connected to a bottom metal electrode of the driving transistor. The sync transistors may include a first sync transistor electrically connected to a first one that is selected from a source electrode of the driving transistor, a gate electrode of the driving transistor, the high power voltage, and the low power voltage, and a second sync transistor electrically connected to a second one that is selected from the source electrode of the driving transistor, the gate electrode of the driving transistor, the high power voltage, and the low power voltage, the second one being different from the first one.

The second sync transistor may be turned off when the first sync transistor is turned on. In addition, the first sync transistor may be turned off when the second sync transistor is turned on.

Another exemplary embodiment of the invention provides a pixel circuit including an organic light-emitting element, a switching transistor configured to be turned on or off in response to a scan signal, a storage capacitor configured to store a data signal applied via a data line when the switching transistor is turned on in response to the scan signal, a driving transistor configured to allow a driving current corresponding to the data signal stored in the storage capacitor to flow into the organic light-emitting element, an emission control transistor electrically connected to the organic light-emitting element and the driving transistor in series between a high power voltage and a low power voltage and configured to be turned on or off in response to an emission control signal, a source sync transistor electrically connected between a source electrode of the driving transistor and a bottom metal electrode of the driving transistor and configured to be turned on or off in response to a source sync control signal, and a gate sync transistor electrically connected between a gate electrode of the driving transistor and the bottom metal electrode of the driving transistor and configured to be turned on or off in response to a gate sync control signal.

The driving transistor may be a p-channel metal oxide semiconductor transistor. In addition, a threshold voltage of the driving transistor may be shifted in a negative direction when the source sync transistor is turned on in response to the source sync control signal.

The source sync control signal may be activated during a first period when a decrease of the driving current flowing into the organic light-emitting element is required. In addition, the source sync transistor may be turned on during the first period to allow a source voltage of the source electrode of the driving transistor to be applied to the bottom metal electrode of the driving transistor.

The driving transistor may be a p-channel metal oxide semiconductor transistor. In addition, a threshold voltage of the driving transistor may be shifted in a positive direction when the gate sync transistor is turned on in response to the gate sync control signal.

The gate sync control signal may be activated during a second period when an increase of the driving current flowing into the organic light-emitting element is required. In addition, the gate sync transistor may be turned on during the second period to allow a gate voltage of the gate electrode of the driving transistor to be applied to the bottom metal electrode of the driving transistor.

The pixel circuit may further include a constant-voltage sync transistor electrically connected between the bottom metal electrode of the driving transistor and a constant-voltage supplying line and configured to be turned on or off in response to a constant-voltage sync control signal.

The driving transistor may be a p-channel metal oxide semiconductor transistor. In addition, a constant-voltage supplied via the constant-voltage supplying line may have a positive voltage level. Further, a threshold voltage of the driving transistor may be shifted in a negative direction when the constant-voltage sync transistor is turned on in response to the constant-voltage sync control signal.

The constant-voltage may be the high power voltage.

The constant-voltage sync control signal may be activated during a third period when a decrease of the driving current flowing into the organic light-emitting element is required. In addition, the constant-voltage sync transistor may be turned on during the third period to allow the constant-voltage to be applied to the bottom metal electrode of the driving transistor.

The driving transistor may be a p-channel metal oxide semiconductor transistor. In addition, a constant-voltage supplied via the constant-voltage supplying line may have a negative voltage level. Further, a threshold voltage of the driving transistor may be shifted in a positive direction when the constant-voltage sync transistor is turned on in response to the constant-voltage sync control signal.

The constant-voltage may be the low power voltage.

The constant-voltage sync control signal may be activated during a fourth period when an increase of the driving current flowing into the organic light-emitting element is required. In addition, the constant-voltage sync transistor may be turned on during the fourth period to allow the constant-voltage to be applied to the bottom metal electrode of the driving transistor.

Another exemplary embodiment of the invention provides a pixel circuit including an organic light-emitting element, a switching transistor configured to be turned on or off in response to a scan signal, a storage capacitor configured to store a data signal applied via a data line when the switching transistor is turned on in response to the scan signal, a driving transistor configured to allow a driving current corresponding to the data signal stored in the storage capacitor to flow into the organic light-emitting element, an emission control transistor electrically connected to the organic light-emitting element and the driving transistor in series between a high power voltage and a low power voltage and configured to be turned on or off in response to an emission control signal, a source sync transistor electrically connected between a source electrode of the driving transistor and a bottom metal electrode of the driving transistor and configured to be turned on or off in response to a source sync control signal, and a constant-voltage sync transistor electrically connected between the bottom metal electrode of the driving transistor and a constant-voltage supplying line and configured to be turned on or off in response to a constant-voltage sync control signal.

The driving transistor may be a p-channel metal oxide semiconductor transistor. In addition, a threshold voltage of the driving transistor may be shifted in a negative direction when the source sync transistor is turned on in response to the source sync control signal.

The driving transistor may be a p-channel metal oxide semiconductor transistor. In addition, a threshold voltage of the driving transistor may be shifted in a positive direction or in a negative direction when the constant-voltage sync transistor is turned on in response to the constant-voltage sync control signal.

Another exemplary embodiment of the invention provides a pixel circuit including an organic light-emitting element, a switching transistor configured to be turned on or off in response to a scan signal, a storage capacitor configured to store a data signal applied via a data line when the switching transistor is turned on in response to the scan signal, a driving transistor configured to allow a driving current corresponding to the data signal stored in the storage capacitor to flow into the organic light-emitting element, an emission control transistor electrically connected to the organic light-emitting element and the driving transistor in series between a high power voltage and a low power voltage and configured to be turned on or off in response to an emission control signal, a gate sync transistor electrically connected between a gate electrode of the driving transistor and a bottom metal electrode of the driving transistor and configured to be turned on or off in response to a gate sync control signal, and a constant-voltage sync transistor electrically connected between the bottom metal electrode of the driving transistor and a constant-voltage supplying line and configured to be turned on or off in response to a constant-voltage sync control signal.

The driving transistor may be a p-channel metal oxide semiconductor transistor. In addition, a threshold voltage of the driving transistor may be shifted in a positive direction when the gate sync transistor is turned on in response to the gate sync control signal.

The driving transistor may be a p-channel metal oxide semiconductor transistor. In addition, a threshold voltage of the driving transistor may be shifted in a positive direction or in a negative direction when the constant-voltage sync transistor is turned on in response to the constant-voltage sync control signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
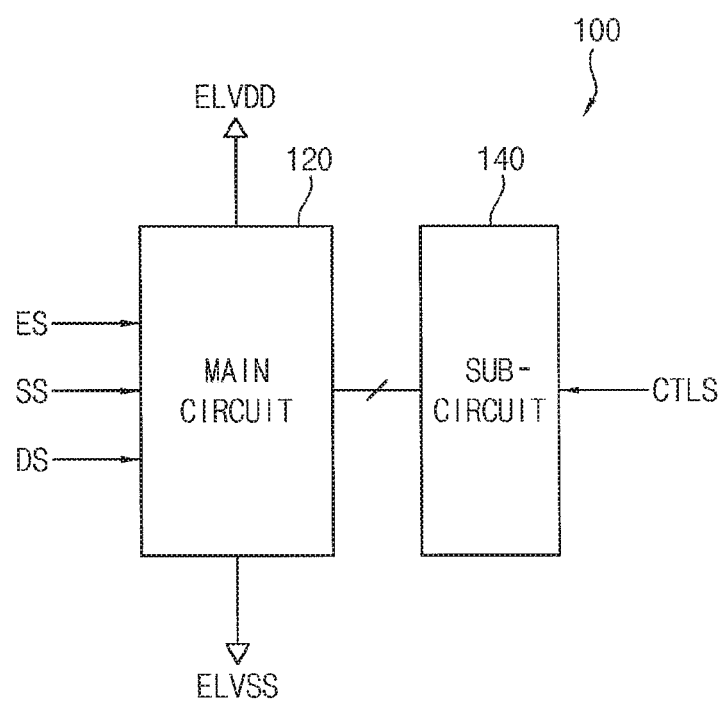
FIG. 1 is a diagram illustrating a pixel circuit according to exemplary embodiments.

In the following description, for the purposes of explanation, numerous specific details are set forth in order to provide a thorough understanding of various exemplary embodiments of the invention. As used herein "embodiments" re non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram illustrating a pixel circuit according to an exemplary embodiment.

Referring to FIG. 1, the pixel circuit 100 included in an organic light-emitting display device may include a main circuit 120 and a sub-circuit 140.

The main circuit 120 may receive a data signal DS in response to a scan signal SS and may output light having luminance corresponding to the data signal DS in response to an emission control signal ES. In an exemplary embodiment, the main circuit 120 may include an organic light-emitting element, a switching transistor, a storage capacitor, a driving transistor, and an emission control transistor. Each of the switching transistor, the driving transistor, and the emission control transistor included in the main circuit 120 may be a p-channel metal oxide semiconductor (PMOS) transistor or an n-channel metal oxide semiconductor (NMOS) transistor. In some exemplary embodiments, each of the switching transistor, the driving transistor, and the emission control transistor included in the main circuit 120 may be implemented by an oxide thin film transistor. Because only essential components (i.e., the organic light-emitting element, the switching transistor, the storage capacitor, the driving transistor, and the emission control transistor) for an operation of the main circuit 120 are mentioned above, it should be understood that the main circuit 120 may further include other components in addition to the above-mentioned components. The organic light-emitting element may be an organic light-emitting diode. The switching transistor may be turned on or off in response to the scan signal SS. The storage capacitor may store the data signal DS applied via a data line when the switching transistor is turned on in response to the scan signal SS. The driving transistor may allow a driving current corresponding to the data signal DS stored in the storage capacitor to flow into the organic light-emitting element. The emission control transistor may be electrically connected to the organic light-emitting element and the driving transistor in series between a high power voltage ELVDD and a low power voltage ELVSS. The emission control transistor may be turned on or off in response to an emission control signal ES. Thus, the pixel circuit 100 may control the organic light-emitting element to emit light during an emission period in which the emission control transistor is turned on and may control the organic light-emitting element not to emit light during a non-emission period in which the emission control transistor is turned off. That is, the pixel circuit 100 may prepare for an emission of the organic light-emitting element during the non-emission period. The organic light-emitting element may emit light having luminance corresponding to the driving current.

The sub-circuit 140 may be electrically connected to the main circuit 120. Specifically, the sub-circuit 140 may receive sync control signals CTLS and may selectively shift a threshold voltage of the driving transistor based on the sync control signals CTLS. For example, the sub-circuit 140 may shift the threshold voltage of the driving transistor in a first direction in order to reduce (or improve) an instantaneous after-image of the organic light-emitting display device, may shift the threshold voltage of the driving transistor in a second direction opposite to the first direction in order to increase (or improve) emission luminance of the organic light-emitting display device, and may not shift the threshold voltage of the driving transistor. In other words, the sub-circuit 140 may selectively shift the threshold voltage of the driving transistor according to operating phases and/or operating conditions of the organic light-emitting display device. To this end, the sub-circuit 140 may include at least two selected from a source sync transistor that is electrically connected between a source electrode of the driving transistor and a bottom metal electrode of the driving transistor and is turned on or off in response to the source sync control signal, a gate sync transistor that is electrically connected between a gate electrode of the driving transistor and the bottom metal electrode of the driving transistor and is turned on or off in response to the gate sync control signal, and a constant-voltage sync transistor that is electrically connected between the bottom metal electrode of the driving transistor and a constant-voltage supplying line and is turned on or off in response to the constant-voltage sync control signal. In an exemplary embodiment, the sub-circuit 140 may include the source sync transistor and the gate sync transistor. This embodiment will be described below with reference to FIGS. 2 and 3. In another exemplary embodiment, the sub-circuit 140 may include the source sync transistor, the gate sync transistor, and the constant-voltage sync transistor. This embodiment will be described below with reference to FIGS. 4 and 5. In still another exemplary embodiment, the sub-circuit 140 may include the source sync transistor and the constant-voltage sync transistor. This embodiment will be described below with reference to FIGS. 6 and 7. In still another exemplary embodiment, the sub-circuit 140 may include the gate sync transistor and the constant-voltage sync transistor. This embodiment will be described below with reference to FIGS. 8 and 9.

In an exemplary embodiment, the sync control signals CTLS (e.g., the source sync control signal, the gate sync control signal, the constant-voltage sync control signal, etc.) may be signals in which activated states are not overlapped, such as the scan signal SS (e.g., a previous scan signal SS(n−1), a current scan signal SS(n), a next scan signal SS(n+1)), the emission control signal ES (e.g., a previous emission control signal ES(n−1), a current emission control signal ES(n), a next emission control signal ES(n+1)), etc. In this case, there is an advantage that it is not necessary to form additional wirings for applying the sync control signals CTLS. In another exemplary embodiment, the sync control signals CTLS may be signals independent of the scan signal SS, the emission control signal ES, etc. In this case, there is an advantage in that it is possible to apply the sync control signals CTLS in various manners. In brief, the pixel circuit 100 may selectively shift the threshold voltage of the driving transistor according to the operating phases and/or the operating conditions of the organic light-emitting display device by including at least two selected from the source sync transistor that is electrically connected between the source electrode of the driving transistor and the bottom metal electrode of the driving transistor and is turned on or off in response to the source sync control signal, the gate sync transistor that is electrically connected between the gate electrode of the driving transistor and the bottom metal electrode of the driving transistor and is turned on or off in response to the gate sync control signal, and the constant-voltage sync transistor that is electrically connected between the bottom metal electrode of the driving transistor and the constant-voltage supplying line and is turned on or off in response to the constant-voltage sync control signal. Thus, the organic light-emitting display device, including the pixel circuit 100, may change a sync operation (or a back-biasing operation) performed on the driving transistor included in the pixel circuit 100 according to the operating phases and/or the operating conditions of the organic light-emitting display device. As a result, the organic light-emitting display device may selectively utilize respective advantages of sync operations (i.e., the source sync operation, the gate sync operation, and the constant-voltage sync operation) according to requirements for its operation (e.g., reducing an instantaneous after-image of the organic light-emitting display device, increasing emission luminance of the organic light-emitting display device, etc.).

Figure 2:
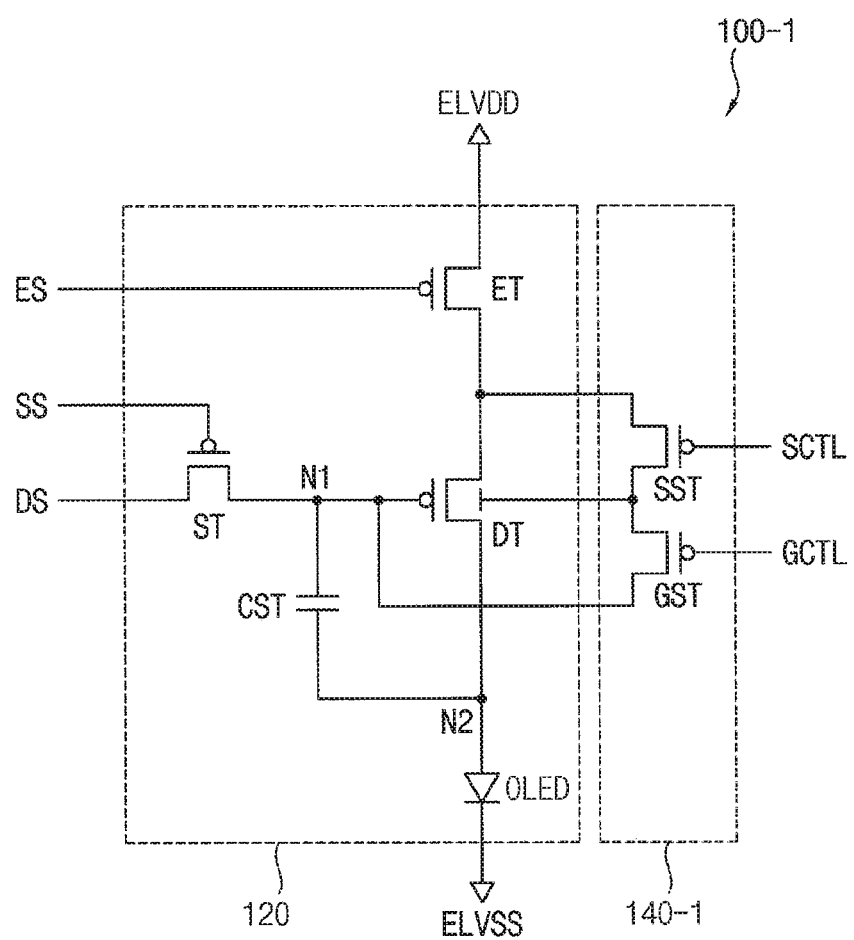
FIG. 2 is a diagram illustrating an example of the pixel circuit of FIG. 1.
Figure 3:
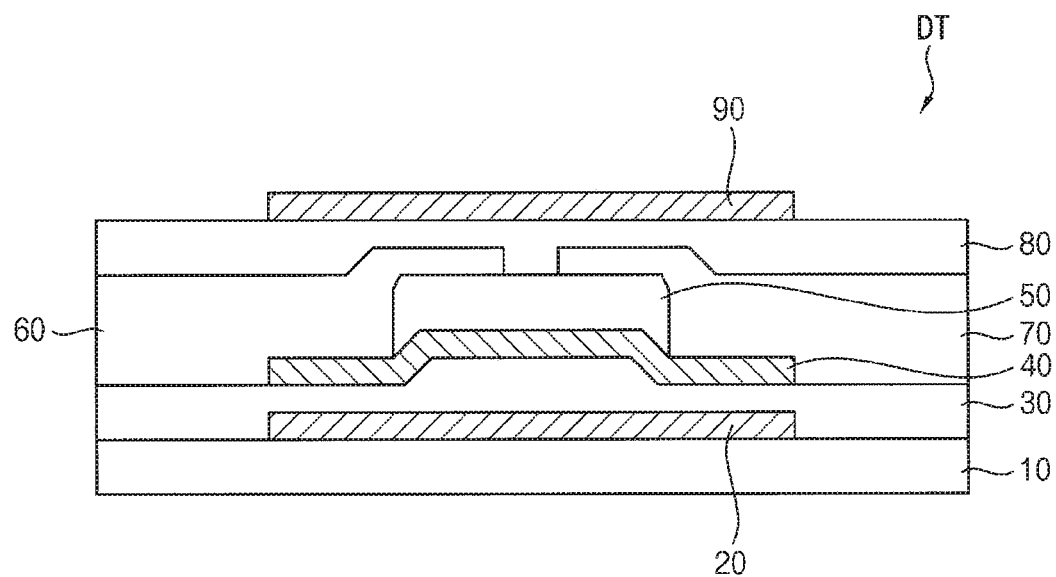
FIG. 3 is a cross-sectional diagram illustrating an example of a structure of a driving transistor included in the pixel circuit of FIG. 1.

FIG. 2 is a diagram illustrating an example of the pixel circuit of FIG. 1, and FIG. 3 is a cross-sectional diagram illustrating an example of a structure of a driving transistor included in the pixel circuit of FIG. 1.

Referring to FIGS. 2 and 3, the pixel circuit 100-1 may include a main circuit 120 and a sub-circuit 140-1.

The main circuit 120 may have a 3T-1C structure (i.e., a structure including three transistors ST, DT, and ET, and one capacitor CST). Specifically, the main circuit 120 may include an organic light-emitting element OLED, a switching transistor ST that is turned on or off in response to a scan signal SS, a storage capacitor CST that stores a data signal DS applied via a data line when the switching transistor ST is turned on in response to the scan signal SS, a driving transistor DT that allows a driving current corresponding to the data signal DS stored in the storage capacitor CST to flow into the organic light-emitting element OLED, and an emission control transistor ET that is electrically connected to the organic light-emitting element OLED and the driving transistor DT in series between a high power voltage ELVDD and a low power voltage ELVSS and is turned on or off in response to an emission control signal ES. In an exemplary embodiment, as illustrated in FIG. 2, the organic light-emitting element OLED may include an anode that is electrically connected to a second node N2 and a cathode to which the low power voltage ELVSS is applied. The switching transistor ST may include a first electrode to which the data signal DS is applied, a second electrode that is electrically connected to a first node N1, and a gate electrode to which the scan signal SS is applied. The storage capacitor CST may include a first electrode that is electrically connected to the first node N1 and a second electrode that is electrically connected to the second node N2. The driving transistor DT may include a first electrode (i.e., a source electrode 60) that is electrically connected to a second electrode of the emission control transistor ET, a second electrode (i.e., a drain electrode 70) that is electrically connected to the second node N2, a gate electrode 90 that is electrically connected to the first node N1, and a bottom metal electrode 20 to which a back-biasing voltage (or a sync voltage) is applied. The emission control transistor ET may include a first electrode to which the high power voltage ELVDD is applied, a second electrode that is electrically connected to the first electrode (i.e., the source electrode 60) of the driving transistor DT, and a gate electrode to which the emission control signal ES is applied.

Although FIG. 2 shows that the main circuit 120 includes the organic light-emitting element OLED, the switching transistor ST, the storage capacitor CST, the driving transistor DT, and the emission control transistor ET, it should be understood that only essential components (i.e., the organic light-emitting element OLED, the switching transistor ST, the storage capacitor CST, the driving transistor DT, and the emission control transistor ET) for an operation of the main circuit 120 are mentioned. That is, the main circuit 120 may further include other components in addition to the organic light-emitting element OLED, the switching transistor ST, the storage capacitor CST, the driving transistor DT, and the emission control transistor ET. For example, the main circuit 120 may further include components for compensating for the threshold voltage of the driving transistor DT and/or components for initializing the nodes N1 and N2. In addition, because connections among the components (i.e., the organic light-emitting element OLED, the switching transistor ST, the storage capacitor CST, the driving transistor DT, and the emission control transistor ET) of the main circuit 120 are shown as an example, the connections among the components of the main circuit 120 are not limited thereto. For example, when the main circuit 120 further includes the components for compensating for the threshold voltage of the driving transistor DT and/or the components for initializing the nodes N1 and N2, the connections among the organic light-emitting element OLED, the switching transistor ST, the storage capacitor CST, the driving transistor DT, and the emission control transistor ET may be changed to form connections among the organic light-emitting element OLED, the switching transistor ST, the storage capacitor CST, the driving transistor DT, the emission control transistor ET, and the additional components. Furthermore, although FIG. 2 shows that the transistors ST, DT, and ET included in the main circuit 120 are PMOS transistors, the transistors ST, DT, and ET included in the main circuit 120 are not limited thereto. For example, each of the transistors ST, DT, and ET included in the main circuit 120 may be an NMOS transistors or a PMOS transistor.

As illustrated in FIG. 2, the driving transistor DT included in the main circuit 120 may be implemented as a PMOS transistor. For example, the driving transistor DT may have a cross-sectional structure as shown in FIG. 3. Specifically, the driving transistor DT may have a cross-sectional structure in which a substrate 10, a bottom metal electrode 20, a gate insulating layer 30, an active layer 40, an etch stopper layer 150, first and second electrodes 60 and 70, a gate insulating layer 80, and a gate electrode 90 are sequentially disposed (or formed). The substrate 10 may be a silicon semiconductor substrate, a glass substrate, a plastic substrate, etc. The bottom metal electrode 20 may be formed on the substrate 10. For example, the bottom metal electrode 20 may be formed by depositing a specific metal and by patterning the deposited metal. The gate insulating layer 30 may be formed on the bottom metal electrode 20. The gate insulating layer 30 may cover the bottom metal electrode 20. The active layer 40 may be formed on the gate insulating layer 30. The active layer 40 may provide a channel region, a source region, and a drain region. Here, a central region (e.g., a region protruding upwardly in FIG. 3) corresponds to the channel region, and a peripheral region corresponds to the source region and the drain region. The etch stopper layer 50 may be formed on the active layer 40. The etch stopper layer 50 may cover a portion of the active layer 40. The first and second electrodes 60 and 70 may be formed on the etch stopper layer 50. The first and second electrodes 60 and 70 may contact with the source region and the drain region of the active layer 40, respectively. The gate insulating layer 80 may be formed on the etch stopper layer 50 and the first and second electrodes 60 and 70. The gate insulating layer 80 may cover the etch stopper layer 50 and the first and second electrodes 60 and 70. The gate electrode 90 may be formed on the gate insulating layer 80. For example, the gate electrode 90 may be formed by depositing a specific metal and by patterning the deposited metal. Because a structure of the driving transistor DT shown in FIG. 3 is only an example, the driving transistor DT may have various other cross-sectional structures. In exemplary embodiments, when the threshold voltage of the driving transistor DT, which is a PMOS transistor, is shifted in a negative direction, an on-current of the driving transistor DT (i.e., a current flowing through the driving transistor DT) may be reduced under the same condition. On the other hand, when the threshold voltage of the driving transistor DT, which is a PMOS transistor, is shifted in a positive direction, the on-current of the driving transistor DT may be increased under the same condition.

The sub-circuit 140-1 may be electrically connected to the main circuit 120. Specifically, the sub-circuit 140-1 may include a source sync transistor SST and a gate sync transistor GST. The source sync transistor SST may be electrically connected between a first electrode (i.e., the source electrode 60) of the driving transistor DT and the bottom metal electrode 20 of the driving transistor DT. The source sync transistor SST may be turned on or off in response to a source sync control signal SCTL. In an exemplary embodiment, as illustrated in FIG. 2, the source sync transistor SST may be implemented as a PMOS transistor. In this case, the source sync transistor SST may be turned on when the source sync control signal SCTL is activated (i.e., when the source sync control signal SCTL has a negative voltage level), and the source sync transistor SST may be turned off when the source sync control signal SCTL is deactivated (i.e., when the source sync control signal SCTL has a positive voltage level). In another exemplary embodiment, the source sync transistor SST may be implemented as an NMOS transistor. In this case, the source sync transistor SST may be turned on when the source sync control signal SCTL is activated (i.e., when the source sync control signal SCTL has a positive voltage level), and the source sync transistor SST may be turned off when the source sync control signal SCTL is deactivated (i.e., when the source sync control signal SCTL has a negative voltage level). The source sync control signal SCTL may be activated during a first period when a decrease of the driving current flowing into the organic light-emitting element OLED is required (e.g., when a reduction of the instantaneous after-image of the organic light-emitting display device is required). Thus, the source sync transistor SST may be turned on during the first period, and thus a source voltage of the first electrode (i.e., the source electrode 60) of the driving transistor DT may be applied to the bottom metal electrode 20 of the driving transistor DT during the first period. As a result, the threshold voltage of the driving transistor DT, which is a PMOS transistor, may be shifted in a negative direction, and thus, the driving current (i.e., a leakage current) flowing through the driving transistor DT may be reduced. In other words, when the source sync transistor SST is turned on, the threshold voltage of the driving transistor DT, which is a PMOS transistor, may be shifted in a negative direction, and thus, the instantaneous after-image of the organic light-emitting display device may be reduced (or improved) because the leakage current flowing through the driving transistor DT is reduced under the same condition.

The gate sync transistor GST may be electrically connected between a gate electrode 90 of the driving transistor DT (i.e., the first node N1) and the bottom metal electrode 20 of the driving transistor DT. The gate sync transistor GST may be turned on or off in response to a gate sync control signal GCTL. In an exemplary embodiment, as illustrated in FIG. 2, the gate sync transistor GST may be implemented as a PMOS transistor. In this case, the gate sync transistor GST may be turned on when the gate sync control signal GCTL is activated (i.e., when the gate sync control signal GCTL has a negative voltage level), and the gate sync transistor GST may be turned off when the gate sync control signal GCTL is deactivated (i.e., when the gate sync control signal GCTL has a positive voltage level). In another exemplary embodiment, the gate sync transistor GST may be implemented as an NMOS transistor. In this case, the gate sync transistor GST may be turned on when the gate sync control signal GCTL is activated (i.e., when the gate sync control signal GCTL has a positive voltage level), and the gate sync transistor GST may be turned off when the gate sync control signal GCTL is deactivated (i.e., when the gate sync control signal GCTL has a negative voltage level). The gate sync control signal GCTL may be activated during a second period when an increase of the driving current flowing into the organic light-emitting element OLED is required (e.g., when an increase of the emission luminance of the organic light-emitting display device is required). Thus, the gate sync transistor GST may be turned on during the second period, and thus, a gate voltage of the gate electrode 90 of the driving transistor DT may be applied to the bottom metal electrode 20 of the driving transistor DT during the second period. As a result, the threshold voltage of the driving transistor DT, which is a PMOS transistor, may be shifted in a positive direction, and thus the driving current flowing through the driving transistor DT may be increased. In other words, when the gate sync transistor GST is turned on, the threshold voltage of the driving transistor DT, which is a PMOS transistor, may be shifted in a positive direction, and thus the emission luminance of the organic light-emitting display device may be increased (or improved) because the driving current flowing through the driving transistor DT is increased under the same condition.

In brief, the pixel circuit 100-1 may selectively shift the threshold voltage of the driving transistor DT according to the operating phases (e.g., an initializing phase, a threshold voltage compensating phase, a data writing phase, an light-emitting phase, etc.) and/or the operating conditions of the organic light-emitting display device by including the source sync transistor SST that is electrically connected between the first electrode (i.e., the source electrode 60) of the driving transistor DT and the bottom metal electrode 20 of the driving transistor DT and is turned on or off in response to the source sync control signal SCTL and the gate sync transistor GST that is electrically connected between the gate electrode of the driving transistor DT (i.e., the first node N1) and the bottom metal electrode 20 of the driving transistor DT and is turned on or off in response to the gate sync control signal GCTL. Thus, the organic light-emitting display device including the pixel circuit 100 may change a sync operation (or a back-biasing operation) performed on the driving transistor included in the pixel circuit 100 according to the operating phases and/or the operating conditions of the organic light-emitting display device. As a result, the organic light-emitting display device may selectively utilize respective advantages of sync operations (i.e., the source sync operation, the gate sync operation, and the constant-voltage sync operation) according to requirements for its operation (e.g., reducing an instantaneous after-image of the organic light-emitting display device, increasing emission luminance of the organic light-emitting display device, etc.). For example, the pixel circuit 100-1 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the source sync transistor SST, may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the gate sync transistor GST, and may not shift the threshold voltage of the driving transistor DT under a third operating condition (or in a third operating phase) by turning off the source sync transistor SST and the gate sync transistor GST. Although it is illustrated in FIG. 2 that the main circuit 120 has a 3T-1C structure (i.e., a structure including three transistors ST, DT, and ET and one capacitor CST), a structure of the main circuit 120 is not limited thereto. For example, the main circuit 120 may have various structures (e.g., a 7T-1C structure) according to requirements for the organic light-emitting display device. In an exemplary embodiment, the source sync control signal SCTL and the gate is sync control signal GCTL may be signals in which activated states are not overlapped, such as the scan signal SS (e.g., a previous scan signal SS(n−1), a current scan signal SS(n), a next scan signal SS(n+1)), the emission control signal ES (e.g., a previous emission control signal ES(n−1), a current emission control signal ES(n), a next emission control signal ES(n+1)), etc. In another exemplary embodiment, the source sync control signal SCTL and the gate sync control signal GCTL may be signals independent of the scan signal SS, the emission control signal ES, etc.

Figure 4:
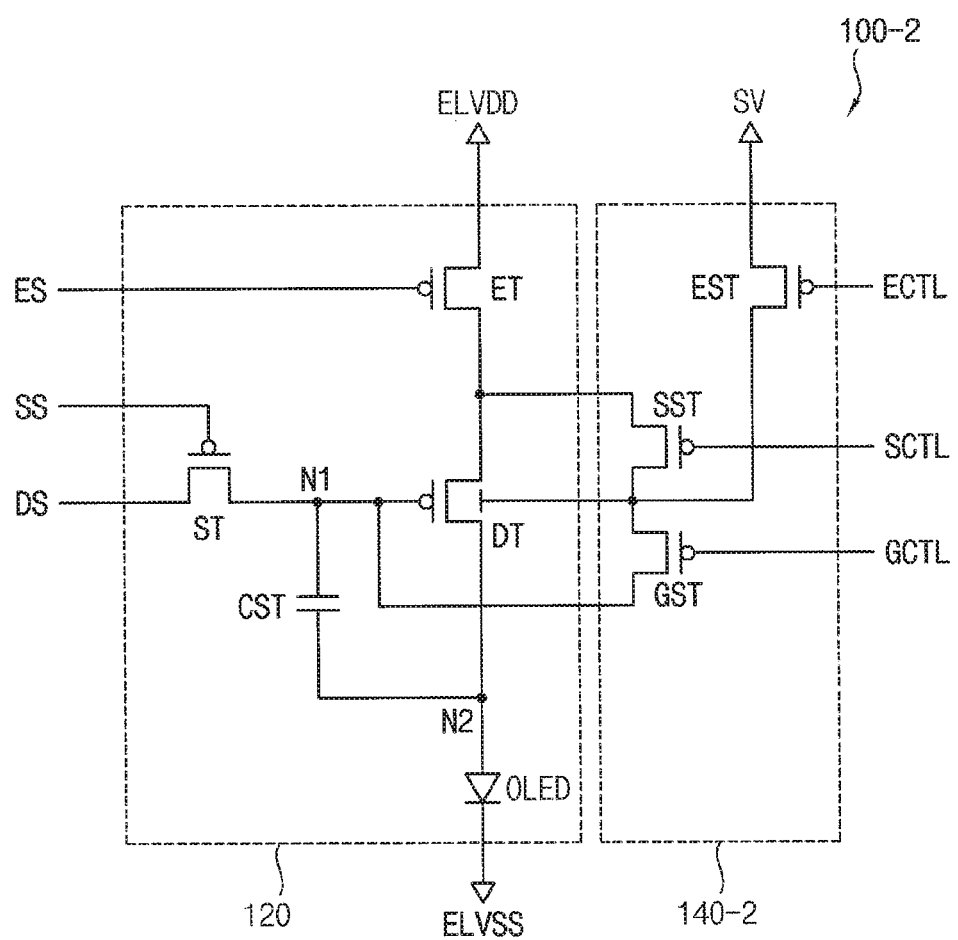
FIG. 4 is a diagram illustrating another example of the pixel circuit of FIG. 1.

FIG. 4 is a diagram illustrating another example of the pixel circuit of FIG. 1.

Referring to FIG. 4, the pixel circuit 100-2 may include a main circuit 120 and a sub-circuit 140-2. The sub-circuit 140-2 further includes a constant-voltage sync transistor EST, but otherwise the pixel circuit 100-2 may be substantially the same as the pixel circuit 100-1 of FIG. 2. Thus, the pixel circuit 100-2 will be described below focusing on the constant-voltage sync transistor EST included in the pixel circuit 100-2. As illustrated in FIG. 4, the driving transistor DT may be a PMOS transistor.

The sub-circuit 140-2 may include the source sync transistor SST, the gate sync transistor GST, and the constant-voltage sync transistor EST. The constant-voltage sync transistor EST may be electrically connected between the bottom metal electrode 20 of the driving transistor DT and a constant-voltage supplying line that transfers a constant-voltage SV. The constant-voltage sync transistor EST may be turned on or off in response to a constant-voltage sync control signal ECTL. In an exemplary embodiment, as illustrated in FIG. 4, the constant-voltage sync transistor EST may be implemented as a PMOS transistor. In this case, the constant-voltage sync transistor EST may be turned on when the constant-voltage sync control signal ECTL is activated (i.e., when the constant-voltage sync control signal ECTL has a negative voltage level), and the constant-voltage sync transistor EST may be turned off when the constant-voltage sync control signal ECTL is deactivated (i.e., when the constant-voltage sync control signal ECTL has a positive voltage level). In another exemplary embodiment, the constant-voltage sync transistor EST may be implemented as an NMOS transistor. In this case, the constant-voltage sync transistor EST may be turned on when the constant-voltage sync control signal ECTL is activated (i.e., when the constant-voltage sync control signal ECTL has a positive voltage level), and the constant-voltage sync transistor EST may be turned off when the constant-voltage sync control signal ECTL is deactivated (i.e., when the constant-voltage sync control signal ECTL has a negative voltage level).

In an exemplary embodiment, the constant-voltage SV that is supplied via the constant-voltage supplying line may have a positive voltage level. For example, the constant-voltage SV may be the high power voltage ELVDD, and the constant-voltage supplying line may be a line that transfers the high power voltage ELVDD. In this case, the threshold voltage of the driving transistor DT may be shifted in a negative direction when the constant-voltage sync transistor EST is turned on in response to the constant-voltage sync control signal ECTL. Thus, the constant-voltage sync control signal ECTL may be activated during a third period when a decrease of the driving current flowing into the organic light-emitting element OLED is required (e.g., when a reduction of the instantaneous after-image of the organic light-emitting display device is required). Thus, the constant-voltage sync transistor EST may be turned on during the third period, and thus the constant-voltage SV having the positive voltage level (e.g., the high power voltage ELVDD) may be applied to the bottom metal electrode 20 of the driving transistor DT during the third period. As a result, the threshold voltage of the driving transistor DT, which is a PMOS transistor, may be shifted in a negative direction, and thus the driving current (i.e., a leakage current) flowing through the driving transistor DT may be reduced. In other words, when the constant-voltage sync transistor EST is turned on, the threshold voltage of the driving transistor DT, which is a PMOS transistor, may be shifted in a negative direction, and thus, the instantaneous after-image of the organic light-emitting display device may be reduced (or improved) because the leakage current flowing through the driving transistor DT is reduced under the same condition.

In another exemplary embodiment, the constant-voltage SV that is supplied via the constant-voltage supplying line may have a negative voltage level. For example, the constant-voltage SV may be the low power voltage ELVSS, and the constant-voltage supplying line may be a line that transfers the low power voltage ELVSS. In this case, the threshold voltage of the driving transistor DT may be shifted in a positive direction when the constant-voltage sync transistor EST is turned on in response to the constant-voltage sync control signal ECTL. Thus, the constant-voltage sync control signal ECTL may be activated during a fourth period when an increase of the driving current flowing into the organic light-emitting element OLED is required (e.g., when an increase of the emission luminance of the organic light-emitting display device is required). Thus, the constant-voltage sync transistor EST may be turned on during the fourth period, and thus, the constant-voltage SV having the negative voltage level may be applied to the bottom metal electrode 20 of the driving transistor DT during the fourth period. As a result, the threshold voltage of the driving transistor DT, which is a PMOS transistor, may be shifted in a positive direction, and thus, the driving current flowing through the driving transistor DT may be increased. In other words, when the constant-voltage sync transistor EST is turned on, the threshold voltage of the driving transistor DT, which is a PMOS transistor, may be shifted in a positive direction, and thus, the emission luminance of the organic light-emitting display device may be increased (or improved) because the driving current flowing through the driving transistor DT is increased under the same condition.

In brief, the pixel circuit 100-2 may selectively shift the threshold voltage of the driving transistor DT according to the operating phases and/or the operating conditions of the organic light-emitting display device by including the source sync transistor SST that is electrically connected between the source electrode 60 of the driving transistor DT and the bottom metal electrode 20 of the driving transistor DT and is turned on or off in response to the source sync control signal SCTL, the gate sync transistor GST that is electrically connected between the gate electrode of the driving transistor DT and the bottom metal electrode 20 of the driving transistor DT and is turned on or off in response to the gate sync control signal GCTL, and the constant-voltage sync transistor EST that is electrically connected between the bottom metal electrode 20 of the driving transistor DT and the constant-voltage supplying line and is turned on or off in response to the constant-voltage sync control signal ECTL. For example, the pixel circuit 100-2 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the source sync transistor SST or the constant-voltage sync transistor EST (i.e., when the constant-voltage SV has the positive voltage level), may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the gate sync transistor GST or the constant-voltage sync transistor EST (i.e., when the constant-voltage SV has the negative voltage level), and may not shift the threshold voltage of the driving transistor DT under a third operating condition (or in a third operating phase) by turning off the source sync transistor SST, the gate sync transistor GST, and the constant-voltage sync transistor EST.

Figure 5:
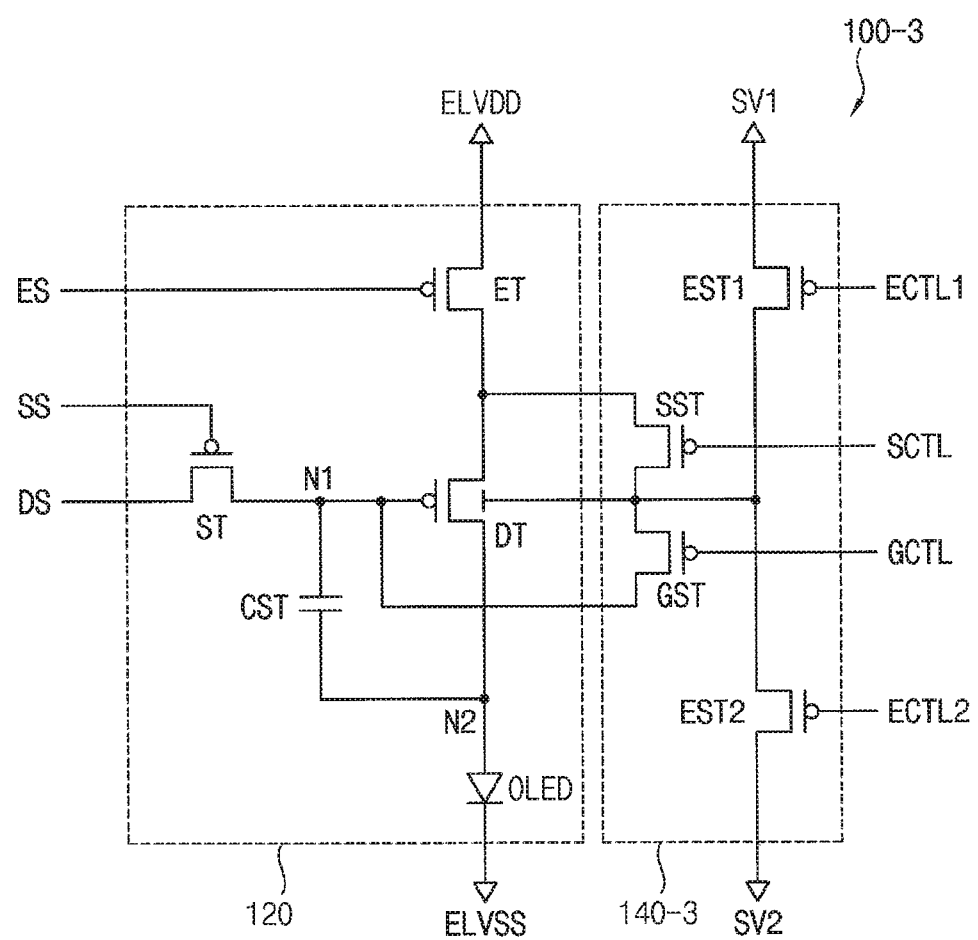
FIG. 5 is a diagram illustrating still another example of the pixel circuit of FIG. 1.

FIG. 5 is a diagram illustrating still another example of the pixel circuit of FIG. 1.

Referring to FIG. 5, the pixel circuit 100-3 may include a main circuit 120 and a sub-circuit 140-3. The sub-circuit 140-3 further includes a first constant-voltage sync transistor EST1 and a second constant-voltage sync transistor EST2, but otherwise the pixel circuit 100-3 may be substantially the same as the pixel circuit 100-1 of FIG. 2. Thus, the pixel circuit 100-3 will be described below focusing on the first constant-voltage sync transistor EST1 and the second constant-voltage sync transistor EST2 included in the pixel circuit 100-3. As illustrated in FIG. 5, the driving transistor DT may be a PMOS transistor.

The sub-circuit 140-3 may include the source sync transistor SST, the gate sync transistor GST, the first constant-voltage sync transistor EST1, and the second constant-voltage sync transistor EST2. The first constant-voltage sync transistor EST1 may be electrically connected between the bottom metal electrode 20 of the driving transistor DT and a first constant-voltage supplying line that transfers a first constant-voltage SV1. The first constant-voltage sync transistor EST1 may be turned on or off in response to a first constant-voltage sync control signal ECTL1. In an exemplary embodiment, as illustrated in FIG. 5, the first constant-voltage sync transistor EST1 may be implemented as a PMOS transistor. In this case, the first constant-voltage sync transistor EST1 may be turned on when the first constant-voltage sync control signal ECTL1 is activated (i.e., when the first constant-voltage sync control signal ECTL1 has a negative voltage level), and the first constant-voltage sync transistor EST1 may be turned off when the first constant-voltage sync control signal ECTL1 is deactivated (i.e., when the first constant-voltage sync control signal ECTL1 has a positive voltage level). In another exemplary embodiment, the first constant-voltage sync transistor EST1 may be implemented as an NMOS transistor. In this case, the first constant-voltage sync transistor EST1 may be turned on when the first constant-voltage sync control signal ECTL1 is activated (i.e., when the first constant-voltage sync control signal ECTL1 has a positive voltage level), and the first constant-voltage sync transistor EST1 may be turned off when the first constant-voltage sync control signal ECTL1 is deactivated (i.e., when the first constant-voltage sync control signal ECTL1 has a negative voltage level). Here, the first constant-voltage SV1 that is supplied via the first constant-voltage supplying line may have a positive voltage level. For example, the first constant-voltage SV1 may be the high power voltage ELVDD, and the first constant-voltage supplying line may be a line that transfers the high power voltage ELVDD. In this case, the threshold voltage of the driving transistor DT may be shifted in a negative direction when the first constant-voltage sync transistor EST1 is turned on in response to the first constant-voltage sync control signal ECTL1. Thus, the first constant-voltage sync control signal ECTL1 may be activated during a third period when a decrease of the driving current flowing into the organic light-emitting element OLED is required (e.g., when a reduction of the instantaneous after-image of the organic light-emitting display device is required). Thus, the first constant-voltage sync transistor EST1 may be turned on during the third period, and thus the first constant-voltage SV1 having the positive voltage level (e.g., the high power voltage ELVDD) may be applied to the bottom metal electrode 20 of the driving transistor DT during the third period. As a result, the threshold voltage of the driving transistor DT, which is a PMOS transistor, may be shifted in a negative direction, and thus the driving current (i.e., a leakage current) flowing through the driving transistor DT may be reduced. In other words, when the first constant-voltage sync transistor EST1 is turned on, the threshold voltage of the driving transistor DT, which is a PMOS transistor, may be shifted in a negative direction, and thus the instantaneous after-image of the organic light-emitting display device may be reduced (or improved) because the leakage current flowing through the driving transistor DT is reduced under the same condition.

The second constant-voltage sync transistor EST2 may be electrically connected between the bottom metal electrode

20 of the driving transistor DT and a second constant-voltage supplying line that transfers a second constant-voltage SV2. The second constant-voltage sync transistor EST2 may be turned on or off in response to a second constant-voltage sync control signal ECTL2. In an exemplary embodiment, as illustrated in FIG. 5, the second constant-voltage sync transistor EST2 may be implemented as a PMOS transistor. In this case, the second constant-voltage sync transistor EST2 may be turned on when the second constant-voltage sync control signal ECTL2 is activated (i.e., when the second constant-voltage sync control signal ECTL2 has a negative voltage level), and the second constant-voltage sync transistor EST2 may be turned off when the second constant-voltage sync control signal ECTL2 is deactivated (i.e., when the second constant-voltage sync control signal ECTL2 has a positive voltage level). In another exemplary embodiment, the second constant-voltage sync transistor EST2 may be implemented as an NMOS transistor. In this case, the second constant-voltage sync transistor EST2 may be turned on when the second constant-voltage sync control signal ECTL2 is activated (i.e., when the second constant-voltage sync control signal ECTL2 has a positive voltage level), and the second constant-voltage sync transistor EST2 may be turned off when the second constant-voltage sync control signal ECTL2 is deactivated (i.e., when the second constant-voltage sync control signal ECTL2 has a negative voltage level). The second constant-voltage SV2 that is supplied via the second constant-voltage supplying line may have a negative voltage level. For example, the second constant-voltage SV2 may be the low power voltage ELVSS, and the second constant-voltage supplying line may be a line that transfers the low power voltage ELVSS. In this case, the threshold voltage of the driving transistor DT may be shifted in a positive direction when the second constant-voltage sync transistor EST2 is turned on in response to the second constant-voltage sync control signal ECTL2. Thus, the second constant-voltage sync control signal ECTL2 may be activated during a fourth period when an increase of the driving current flowing into the organic light-emitting element OLED is required (e.g., when an increase of the emission luminance of the organic light-emitting display device is required). Thus, the second constant-voltage sync transistor EST2 may be turned on during the fourth period, and thus, the second constant-voltage SV2 having the negative voltage level may be applied to the bottom metal electrode 20 of the driving transistor DT during the fourth period. As a result, the threshold voltage of the driving transistor DT, which is a PMOS transistor, may be shifted in a positive direction, and thus, the driving current flowing through the driving transistor DT may be increased. In other words, when the second constant-voltage sync transistor EST2 is turned on, the threshold voltage of the driving transistor DT, which is a PMOS transistor, may be shifted in a positive direction, and thus, the emission luminance of the organic light-emitting display device may be increased (or improved) because the driving current flowing through the driving transistor DT is increased under the same condition.

The pixel circuit 100-3 may selectively shift the threshold voltage of the driving transistor DT according to the operating phases and/or the operating conditions of the organic light-emitting display device by including the source sync transistor SST that is electrically connected between the source electrode 60 of the driving transistor DT and the bottom metal electrode 20 of the driving transistor DT and is turned on or off in response to the source sync control signal SCTL, the gate sync transistor GST that is electrically connected between the gate electrode of the driving transistor DT and the bottom metal electrode 20 of the driving transistor DT and is turned on or off in response to the gate sync control signal GCTL, the first constant-voltage sync transistor EST1 that is electrically connected between the bottom metal electrode 20 of the driving transistor DT and the first constant-voltage supplying line and is turned on or off in response to the first constant-voltage sync control signal ECTL1, and the second constant-voltage sync transistor EST2 that is electrically connected between the bottom metal electrode 20 of the driving transistor DT and the second constant-voltage supplying line and is turned on or off in response to the second constant-voltage sync control signal ECTL2. For example, the pixel circuit 100-3 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the source sync transistor SST or the first constant-voltage sync transistor EST1, may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the gate sync transistor GST or the second constant-voltage sync transistor EST2, and may not shift the threshold voltage of the driving transistor DT under a third operating condition (or in a third operating phase) by turning off the source sync transistor SST, the gate sync transistor GST, the first constant-voltage sync transistor EST1, and the second constant-voltage sync transistor EST2.

Figure 6:
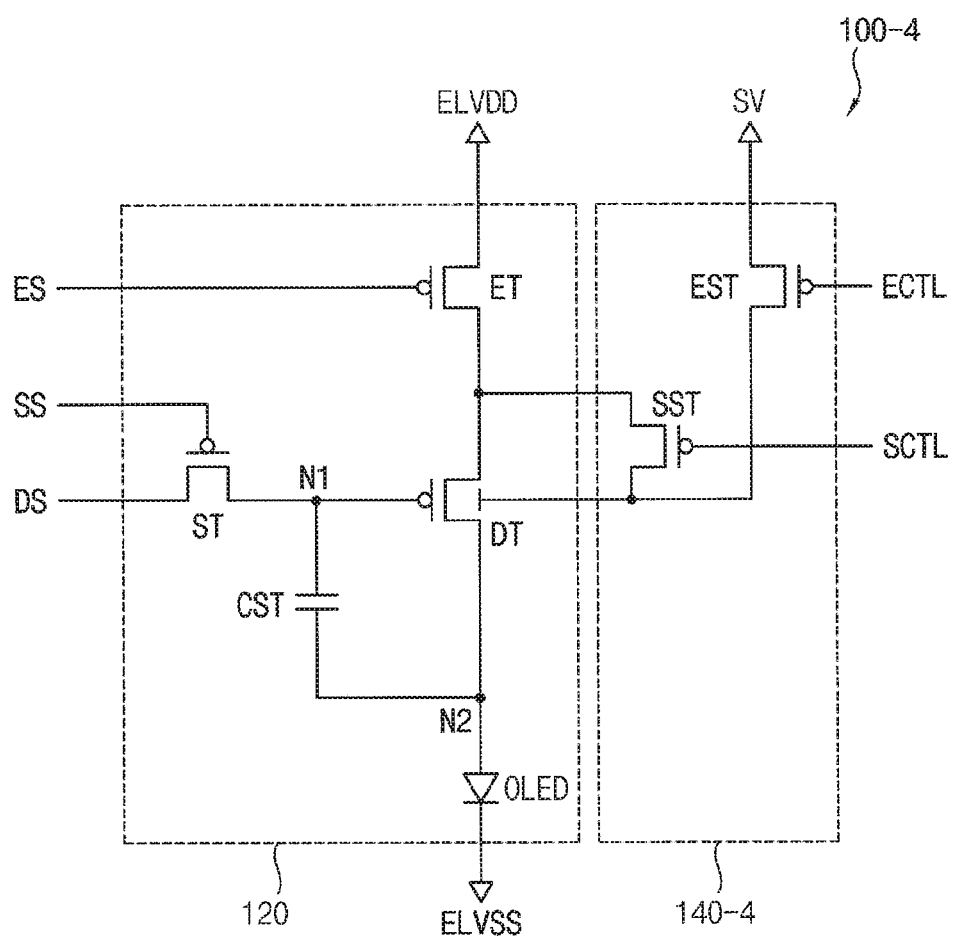
FIG. 6 is a diagram illustrating still another example of the pixel circuit of FIG. 1.

FIG. 6 is a diagram illustrating still another example of the pixel circuit of FIG. 1.

Referring to FIG. 6, the pixel circuit 100-4 may include a main circuit 120 and a sub-circuit 140-4. The sub-circuit 140-4 does not include a gate sync transistor GST, but otherwise the pixel circuit 100-4 may be substantially the same as the pixel circuit 100-2 of FIG. 4. That is, the sub-circuit 140-4 of the pixel circuit 100-4 may include a source sync transistor SST and a constant-voltage sync transistor EST. As illustrated in FIG. 6, the driving transistor DT may be a PMOS transistor. The source sync transistor SST may be electrically connected between the source electrode 60 of the driving transistor DT and the bottom metal electrode 20 of the driving transistor DT. The source sync transistor SST may be turned on or off in response to the source sync control signal SCTL. The constant-voltage sync transistor EST may be electrically connected between the bottom metal electrode 20 of the driving transistor DT and the constant-voltage supplying line that transfers the constant-voltage SV. The constant-voltage sync transistor EST may be turned on or off in response to the constant-voltage sync control signal ECTL. Here, the constant-voltage SV may have a positive voltage level (e.g., the high power voltage ELVDD) or a negative voltage level. Since the source sync transistor SST and the constant-voltage sync transistor EST are described above, a duplicate description related thereto will not be repeated. In brief, the pixel circuit 100-4 may selectively shift the threshold voltage of the driving transistor DT according to the operating phases and/or the operating conditions of the organic light-emitting display device by including the source sync transistor SST and the constant-voltage sync transistor EST. For example, the pixel circuit 100-4 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the source sync transistor SST or the constant-voltage sync transistor EST (i.e., when the constant-voltage SV has the positive voltage level), may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the constant-voltage sync transistor EST (i.e., when the constant-voltage SV has the negative voltage level), and may not shift the threshold voltage of the driving transistor DT under a third operating condition (or in a third operating phase) by turning off the source sync transistor SST and the constant-voltage sync transistor EST.

Figure 7:
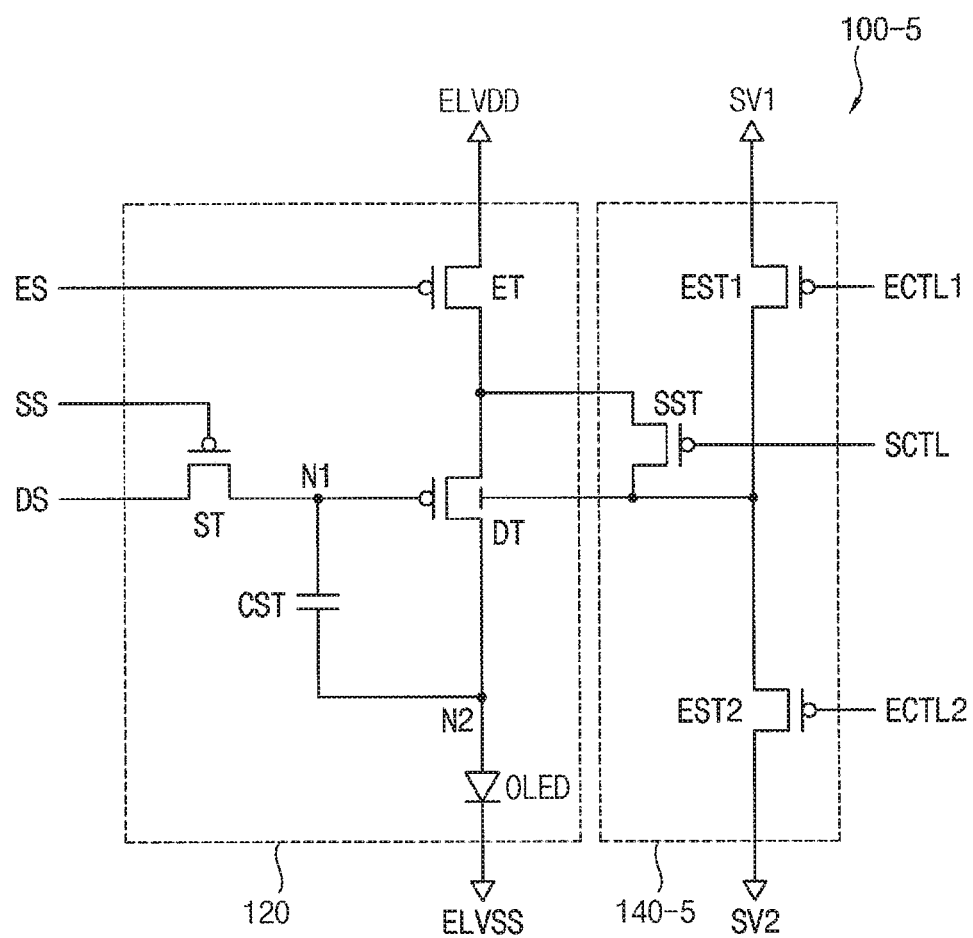
FIG. 7 is a diagram illustrating still another example of the pixel circuit of FIG. 1.

FIG. 7 is a diagram illustrating still another example of the pixel circuit of FIG. 1.

Referring to FIG. 7, the pixel circuit 100-5 may include a main circuit 120 and a sub-circuit 140-5. The sub-circuit 140-5 does not include a gate sync transistor GST, but otherwise the pixel circuit 100-5 may be substantially the same as the pixel circuit 100-3 of FIG. 5. That is, the sub-circuit 140-5 of the pixel circuit 100-5 may include a source sync transistor SST, a first constant-voltage sync transistor EST1, and a second constant-voltage sync transistor EST2. As illustrated in FIG. 7, the driving transistor DT may be a PMOS transistor. The source sync transistor SST may be electrically connected between the source electrode 60 of the driving transistor DT and the bottom metal electrode 20 of the driving transistor DT. The source sync transistor SST may be turned on or off in response to the source sync control signal SCTL. The first constant-voltage sync transistor EST1 may be electrically connected between the bottom metal electrode 20 of the driving transistor DT and the first constant-voltage supplying line that transfers the first constant-voltage SV1. The first constant-voltage sync transistor EST1 may be turned on or off in response to the first constant-voltage sync control signal ECTL1. Here, the first constant-voltage SV1 may have a positive voltage level (e.g., the high power voltage ELVDD). The second constant-voltage sync transistor EST2 may be electrically connected between the bottom metal electrode 20 of the driving transistor DT and the second constant-voltage supplying line that transfers the second constant-voltage SV2. The second constant-voltage sync transistor EST2 may be turned on or off in response to the second constant-voltage sync control signal ECTL2. Here, the second constant-voltage SV2 may have a negative voltage level. Since the source sync transistor SST, the first constant-voltage sync transistor EST1, and the second constant-voltage sync transistor EST2 are described above, a duplicate description related thereto will not be repeated. In brief, the pixel circuit 100-5 may selectively shift the threshold voltage of the driving transistor DT according to the operating phases and/or the operating conditions of the organic light-emitting display device by including the source sync transistor SST, the first constant-voltage sync transistor EST1, and the second constant-voltage sync transistor EST2. For example, the pixel circuit 100-5 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the source sync transistor SST or the first constant-voltage sync transistor EST1, may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the second constant-voltage sync transistor EST2, and may not shift the threshold voltage of the driving transistor DT under a third operating condition (or in a third operating phase) by turning off the source sync transistor SST, the first constant-voltage sync transistor EST1, and the second constant-voltage sync transistor EST2.

Figure 8:
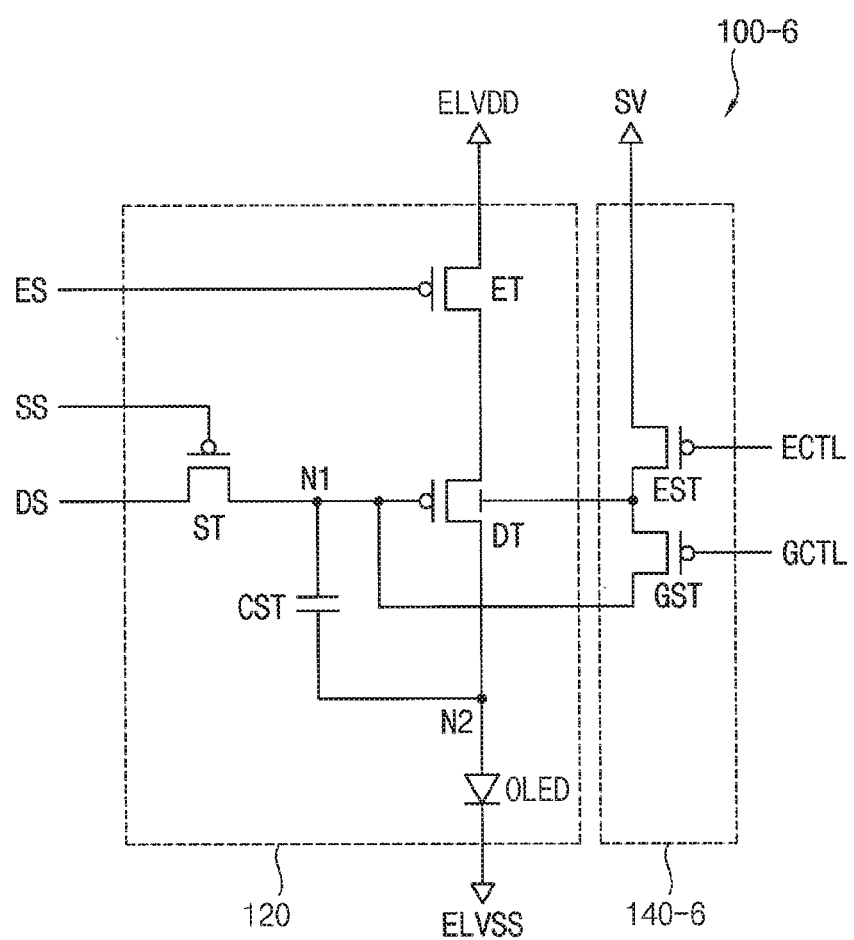
FIG. 8 is a diagram illustrating still another example of the pixel circuit of FIG. 1.

FIG. 8 is a diagram illustrating still another example of the pixel circuit of FIG. 1.

Referring to FIG. 8, the pixel circuit 100-6 may include a main circuit 120 and a sub-circuit 140-6. The sub-circuit 140-6 does not include a source sync transistor SST, but otherwise the pixel circuit 100-6 may be substantially the same as the pixel circuit 100-2 of FIG. 4. That is, the sub-circuit 140-6 of the pixel circuit 100-6 may include a gate sync transistor GST and a constant-voltage sync transistor EST. As illustrated in FIG. 8, the driving transistor DT may be a PMOS transistor. The gate sync transistor GST may be electrically connected between the gate electrode of the driving transistor DT (i.e., the first node N1) and the bottom metal electrode 20 of the driving transistor DT. The gate sync transistor GST may be turned on or off in response to the gate sync control signal GCTL. The constant-voltage sync transistor EST may be electrically connected between the bottom metal electrode 20 of the driving transistor DT and the constant-voltage supplying line that transfers the constant-voltage SV. The constant-voltage sync transistor EST may be turned on or off in response to the constant-voltage sync control signal ECTL. Here, the constant-voltage SV may have a positive voltage level (e.g., the high power voltage ELVDD) or a negative voltage level. Since the gate sync transistor GST and the constant-voltage sync transistor EST are described above, a duplicate description related thereto will not be repeated. In brief, the pixel circuit 100-6 may selectively shift the threshold voltage of the driving transistor DT according to the operating phases and/or the operating conditions of the organic light-emitting display device by including the gate sync transistor GST and the constant-voltage sync transistor EST. For example, the pixel circuit 100-6 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the constant-voltage sync transistor EST (i.e., when the constant-voltage SV has the positive voltage level), may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the gate sync transistor GST or the constant-voltage sync transistor EST (i.e., when the constant-voltage SV has the negative voltage level), and may not shift the threshold voltage of the driving transistor DT under a third operating condition (or in a third operating phase) by turning off the gate sync transistor GST and the constant-voltage sync transistor EST.

Figure 9:
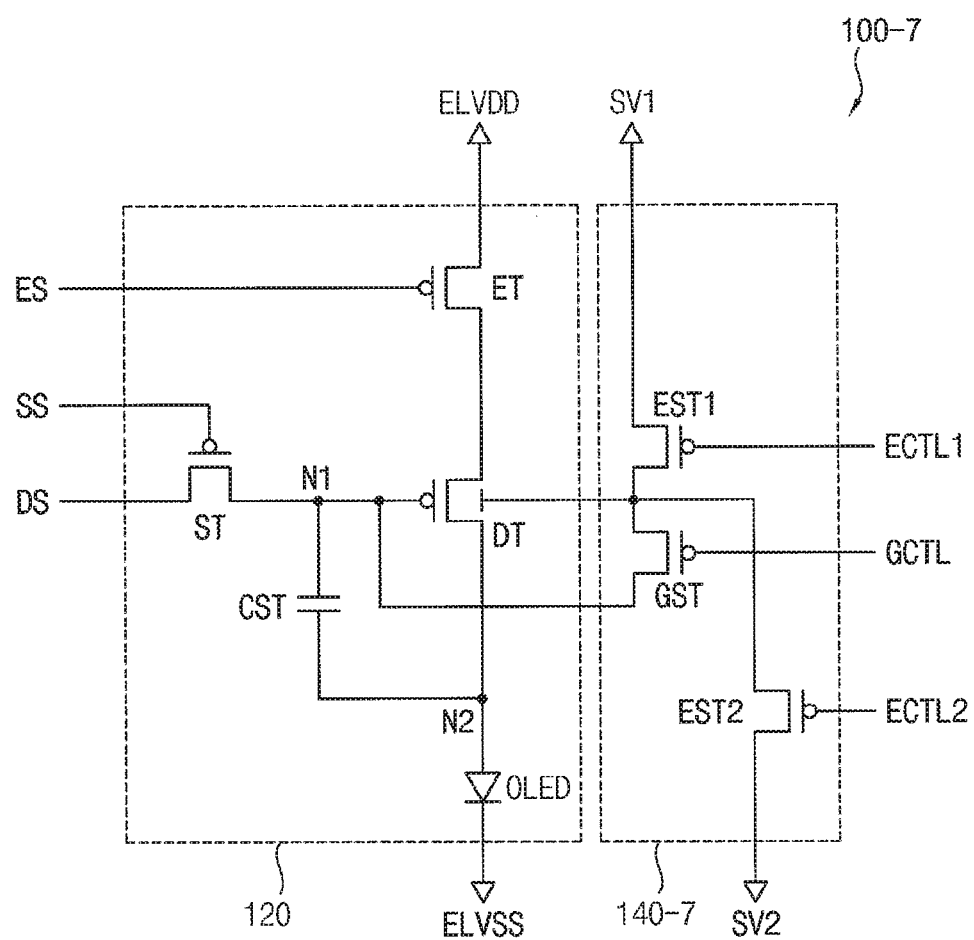
FIG. 9 is a diagram illustrating still another example of the pixel circuit of FIG. 1.

FIG. 9 is a diagram illustrating still another example of the pixel circuit of FIG. 1.

Referring to FIG. 9, the pixel circuit 100-7 may include a main circuit 120 and a sub-circuit 140-7. The sub-circuit 140-7 does not include a source sync transistor SST, but otherwise the pixel circuit 100-7 may be substantially the same as the pixel circuit 100-3 of FIG. 5. That is, the sub-circuit 140-7 of the pixel circuit 100-7 may include a gate sync transistor GST, a first constant-voltage sync transistor EST1, and a second constant-voltage sync transistor EST2. As illustrated in FIG. 9, the driving transistor DT may be a PMOS transistor. The gate sync transistor GST may be electrically connected between the gate electrode of the driving transistor DT (i.e., the first node N1) and the bottom metal electrode 20 of the driving transistor DT. The gate sync transistor GST may be turned on or off in response to the gate sync control signal GCTL. The first constant-voltage sync transistor EST1 may be electrically connected between the bottom metal electrode 20 of the driving transistor DT and the first constant-voltage supplying line that transfers the first constant-voltage SV1. The first constant-voltage sync transistor EST1 may be turned on or off in response to the first constant-voltage sync control signal ECTL1. Here, the first constant-voltage SV1 may have a positive voltage level (e.g., the high power voltage ELVDD). The second constant-voltage sync transistor EST2 may be electrically connected between the bottom metal electrode 20 of the driving transistor DT and the second constant-voltage supplying line that transfers the second constant-voltage SV2. The second constant-voltage sync transistor EST2 may be turned on or off in response to the second constant-voltage sync control signal ECTL2. Here, the second constant-voltage SV2 may have a negative voltage level. Since the gate sync transistor GST, the first constant-voltage sync transistor EST1, and the second constant-voltage sync transistor EST2 are described above, a duplicate description related thereto will not be repeated. In brief, the pixel circuit 100-7 may selectively shift the threshold voltage of the driving transistor DT according to the operating phases and/or the operating conditions of the organic light-emitting display device by including the gate sync transistor GST, the first constant-voltage sync transistor EST1, and the second constant-voltage sync transistor EST2. For example, the pixel circuit 100-7 may shift the threshold voltage of the driving transistor DT in a first direction (i.e., may shift the threshold voltage of the driving transistor DT in a negative direction when the driving transistor DT is a PMOS transistor) to reduce the instantaneous after-image of the organic light-emitting display device under a first operating condition (or in a first operating phase) by turning on the first constant-voltage sync transistor EST1, may shift the threshold voltage of the driving transistor DT in a second direction (i.e., may shift the threshold voltage of the driving transistor DT in a positive direction when the driving transistor DT is a PMOS transistor) to increase the emission luminance of the organic light-emitting display device under a second operating condition (or in a second operating phase) by turning on the gate sync transistor GST or the second constant-voltage sync transistor EST2, and may not shift the threshold voltage of the driving transistor DT under a third operating condition (or in a third operating phase) by turning off the gate sync transistor GST, the first constant-voltage sync transistor EST1, and the second constant-voltage sync transistor EST2.

Figure 10:
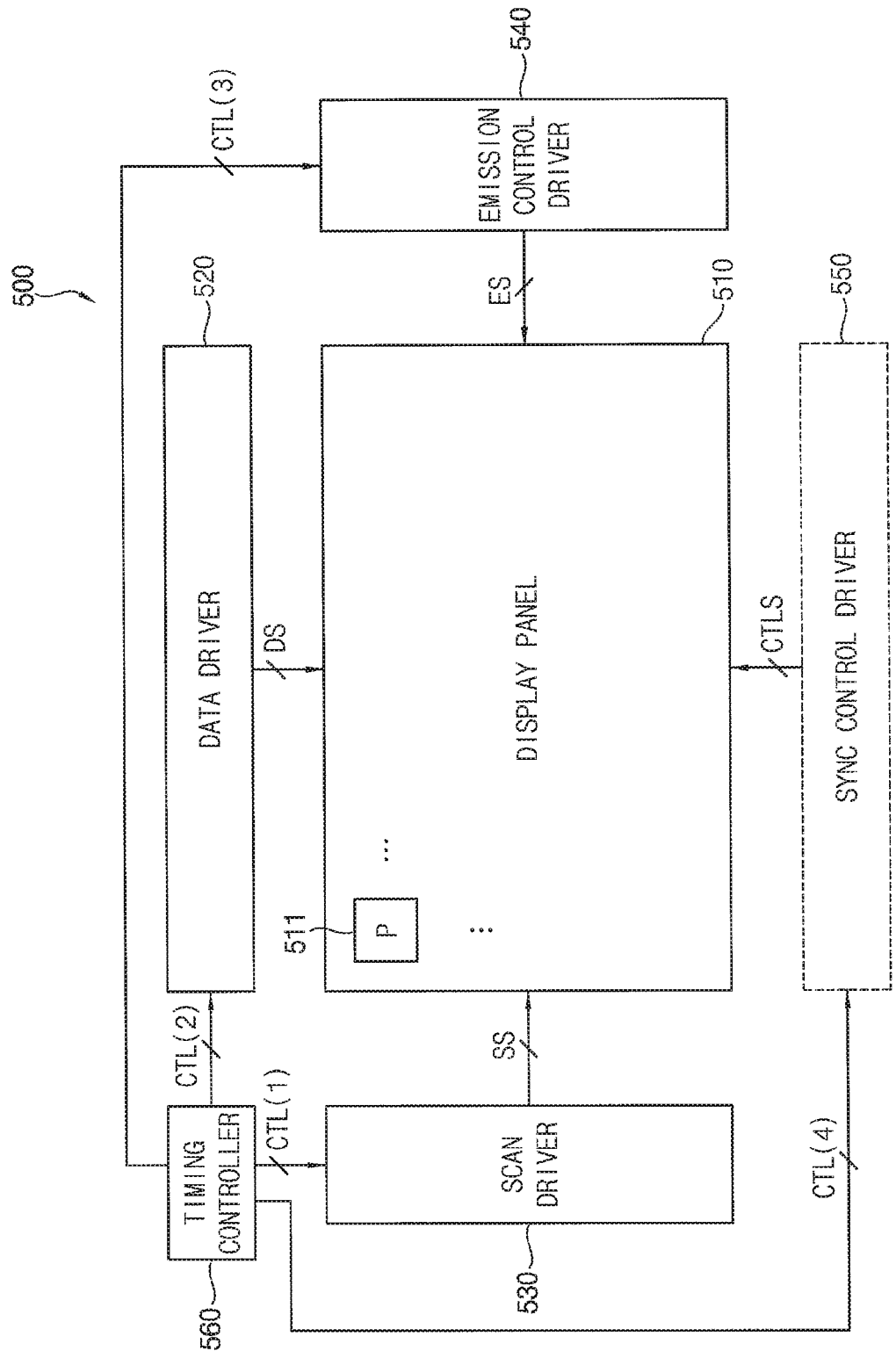
FIG. 10 is a block diagram illustrating an organic light-emitting display device according to exemplary embodiments.

FIG. 10 is a block diagram illustrating an organic light-emitting display device according to exemplary embodiments.

Referring to FIG. 10, the organic light-emitting display device 500 may include a display panel 510, a data driver 520, a scan driver 530, an emission control driver 540, and a timing controller 560. In some exemplary embodiments, the organic light-emitting display device 500 may further include a sync control driver 550.

The display panel 510 may include a plurality of pixel circuits 511. The display panel 510 may be connected to the data driver 520 via a plurality of data lines. The display panel 510 may be connected to the scan driver 530 via a plurality of scan lines. The display panel 510 may be connected to the emission control driver 540 via a plurality of emission control-lines. The data driver 520 may provide a data signal DS to the display panel 510 via the data lines. That is, the data driver 520 may provide the data signal DS to the pixel circuits 511. The scan driver 530 may provide a scan signal SS to the display panel 510 via the scan lines. That is, the scan driver 530 may provide the scan signal SS to the pixel circuits 511. The emission control driver 540 may provide an emission control signal ES to the display panel 510 via the emission control-lines. That is, the emission control driver 540 may provide the emission control signal ES to the pixel circuits 511. In an exemplary embodiment, the sync control signals CTLS (e.g., a source sync control signal, a gate sync control signal, a constant-voltage sync control signal, etc.) may be determined as signals independent of the scan signal SS (e.g., a previous scan signal SS(n−1), a current scan signal SS(n), a next scan signal SS(n+1)), the emission control signal ES (e.g., a previous emission control signal ES(n−1), a current emission control signal ES(n), a next emission control signal ES(n+1)), etc. In this case, the organic light-emitting display device 500 may include the sync control driver 550, and the sync control driver 550 may provide the sync control signals CTLS to the display panel 510. That is, the sync control driver 550 may provide the sync control signals CTLS to the pixel circuits 511. In another exemplary embodiment, the sync control signals CTLS (e.g., a source sync control signal, a gate sync control signal, a constant-voltage sync control signal, etc.) may be determined as signals of which activated states are not overlapped, such as the scan signal SS, the emission control signal ES, etc. In this case, the organic light-emitting display device 500 may not include the sync control driver 550. The timing controller 560 may control the scan driver 530, the data driver 520, the emission control driver 540, and the sync control driver 550 by generating and providing a plurality of control signals CTL(1), CTL(2), CTL(3), and CTL(4) to the scan driver 530, the data driver 520, the emission control driver 540, and the sync control driver 550. The timing controller 560 may receive image data and perform a specific data processing (e.g., deterioration compensating, etc.) on the image data.

In exemplary embodiments, the pixel circuit 511 included in the display panel 510 may include a main circuit and a sub-circuit that is electrically connected to the main circuit. The main circuit may receive the data signal DS in response to the scan signal SS and may output light having luminance corresponding to the data signal DS in response to the emission control signal ES. In an exemplary embodiment, the main circuit may include an organic light-emitting element, a switching transistor, a storage capacitor, a driving transistor, and an emission control transistor. In some exemplary embodiments, the main circuit may further include other components as well as the components (i.e., the organic light-emitting element, the switching transistor, the storage capacitor, the driving transistor, and the emission control transistor. The sub-circuit may receive sync control signals CTLS and may selectively shift a threshold voltage of the driving transistor included in the main circuit based on the sync control signals CTLS. For example, the sub-circuit may shift the threshold voltage of the driving transistor in a first direction in order to reduce (or improve) instantaneous after-image of the organic light-emitting display device 500, may shift the threshold voltage of the driving transistor in a second direction opposite to the first direction in order to increase (or improve) emission luminance of the organic light-emitting display device 500, and may not shift the threshold voltage of the driving transistor. In other words, the sub-circuit may selectively shift the threshold voltage of the driving transistor according to operating phases and/or operating conditions of the organic light-emitting display device 500. To this end, the sub-circuit may include at least two selected from a source sync transistor that is electrically connected between a source electrode of the driving transistor and a bottom metal electrode of the driving transistor and is turned on or off in response to a source sync control signal, a gate sync transistor that is electrically connected between a gate electrode of the driving transistor and the bottom metal electrode of the driving transistor and is turned on or off in response to a gate sync control signal, and a constant-voltage sync transistor that is electrically connected between the bottom metal electrode of the driving transistor and a constant-voltage supplying line and is turned on or off in response to a constant-voltage sync control signal. In brief, the organic light-emitting display device 500 may selectively utilize respective advantages of sync operations (i.e., a source sync operation, a gate sync operation, and a constant-voltage sync operation) according to requirements for its operation (e.g., reducing an instantaneous after-image of the organic light-emitting display device 500, increasing emission luminance of the organic light-emitting display device 500, etc.) by including the pixel circuit 511 that can selectively shift the threshold voltage of the driving transistor according to operating phases and/or operating conditions of the organic light-emitting display device 500, where the pixel circuit 511 includes at least two of the source sync transistor, the gate sync transistor, and the constant-voltage sync transistor. Thus, the organic light-emitting display device 500 may provide a high-quality image to a viewer. Since these exemplary embodiments are described above, a duplicate description related thereto will not be repeated.

Figure 11:
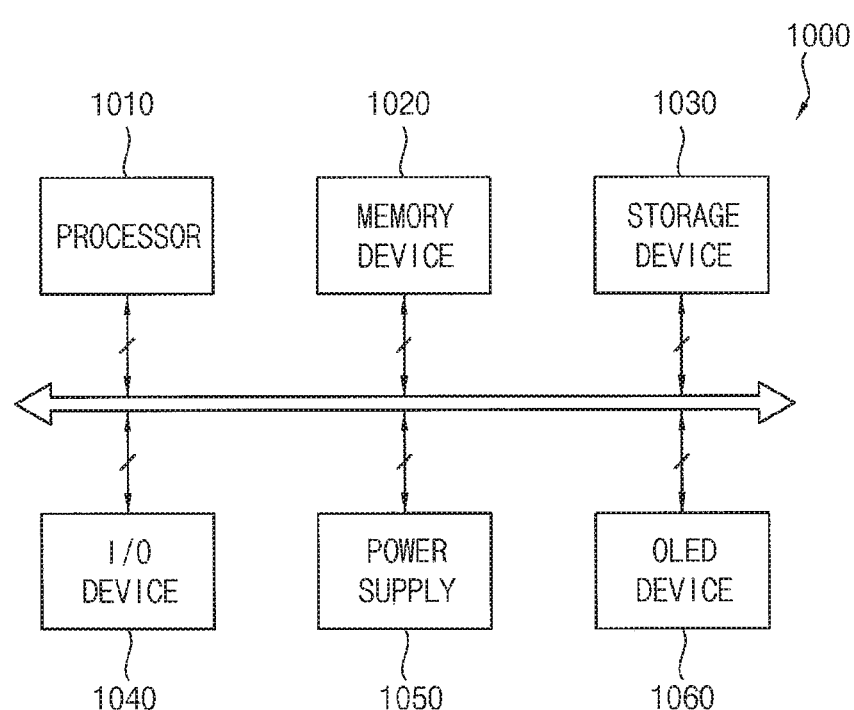
FIG. 11 is a block diagram illustrating an electronic device according to exemplary embodiments.
Figure 12:
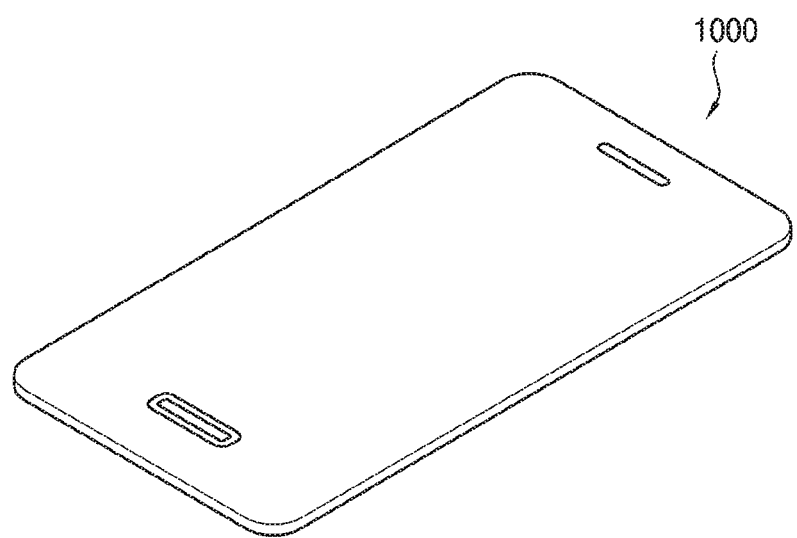
FIG. 12 is a diagram illustrating an example in which the electronic device of FIG. 11 is implemented as a smart phone.

FIG. 11 is a block diagram illustrating an electronic device according to exemplary embodiments, and FIG. 12 is a diagram illustrating an example in which the electronic device of FIG. 11 is implemented as a smart phone.

Referring to FIGS. 11 and 12, the electronic device 1000 may include a processor 1010, a memory device 1020, a storage device 1030, an input/output (I/O) device 1040, a power supply 1050, and an organic light-emitting display device 1060. Here, the organic light-emitting display device 1060 may be the organic light-emitting display device 500 of FIG. 10. In addition, the electronic device 1000 may further include a plurality of ports for communicating with a video card, a sound card, a memory card, a universal serial bus (USB) device, other electronic devices, etc. In an exemplary embodiment, as illustrated in FIG. 12, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, etc.

The processor 1010 may perform various computing functions. The processor 1010 may be a microprocessor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 1030 may include a solid state drive (SSD) device, a hard disk drive (HDD) device, a CD-ROM device, etc. The I/O device 1040 may include an input device such as a keyboard, a keypad, a mouse device, a touch-pad, a touch-screen, etc., and an output device such as a printer, a speaker, etc. In some exemplary embodiments, the I/O device 1040 may include the organic light-emitting display device 1060. The power supply 1050 may provide power for operations of the electronic device 1000. The organic light-emitting display device 1060 may be coupled to other components via the buses or other communication links.

As described above, the organic light-emitting display device 1060 may selectively utilize respective advantages of sync operations (i.e., a source sync operation, a gate sync operation, and a constant-voltage sync operation) according to requirements for its operation (e.g., reducing an instantaneous after-image of the organic light-emitting display device 1060, increasing emission luminance of the organic light-emitting display device 1060, etc.). Thus, the organic light-emitting display device 1060 may provide a high-quality image to a viewer. To this end, the organic light-emitting display device 1060 may include a display panel having a plurality of pixel circuits, where each of the pixel circuits is capable of selectively shifting a threshold voltage of a driving transistor therein according to operating phases and/or operating conditions of the organic light-emitting display device 1060 by including at least two selected from a source sync transistor, a gate sync transistor, and a constant-voltage sync transistor, a data driver that provides a data signal to the pixel circuits, a scan driver that provides a scan signal to the pixel circuits, an emission control driver that provides an emission control signal to the pixel circuits, and a timing controller that controls the data driver, the scan driver, and the emission control driver. In some exemplary embodiments, the organic light-emitting display device 1060 may further include a sync control driver that provides sync control signals (e.g., a source sync control signal, a gate sync control signal, and a constant-voltage sync control signal) to the pixel circuits. In an exemplary embodiment, as described with reference to FIG. 2, each of the pixel circuits may include the source sync transistor and the gate sync transistor. In another exemplary embodiment, as described with reference to FIG. 4, each of the pixel circuits may include the source sync transistor, the gate sync transistor, and the constant-voltage sync transistor. In still another exemplary embodiment, as described with reference to FIG. 5, the pixel circuit may include the source sync transistor, the gate sync transistor, a first constant-voltage sync transistor, and a second constant-voltage sync transistor. In still another exemplary embodiment, as described with reference to FIG. 6, each of the pixel circuits may include the source sync transistor and the constant-voltage sync transistor. In still another Exemplary embodiment, as described with reference to FIG. 7, each of the pixel circuits may include the source sync transistor, the first constant-voltage sync transistor, and the second constant-voltage sync transistor. In still another exemplary embodiment, as described with reference to FIG. 8, each of the pixel circuits may include the gate sync transistor and the constant-voltage sync transistor. In still another exemplary embodiment, as described with reference to FIG. 9, each of the pixel circuits may include the gate sync transistor, the first constant-voltage sync transistor, and the second constant-voltage sync transistor. Since these embodiments are described above, a duplicate description related thereto will not be repeated.

The present inventive concept may be applied to an organic light-emitting display device and an electronic device including the organic light-emitting display device. For example, the present inventive concept may be applied to a cellular phone, a smart phone, a video phone, a smart pad, a smart watch, a tablet PC, a car navigation system, a television, a computer monitor, a laptop, a head mounted display device, an MP3 player, etc.

A pixel circuit according to the inventive concepts may selectively shift a threshold voltage of a driving transistor according to operating phases and/or operating conditions of an organic light-emitting display device (e.g., may shift the threshold voltage of the driving transistor in a first direction to reduce (or improve) an instantaneous after-image of the organic light-emitting display device under a first operating condition (or in a first operating phase), may shift the threshold voltage of the driving transistor in a second direction opposite to the first direction to increase (or improve) emission luminance of the organic light-emitting display device under a second operating condition (or in a second operating phase), and may not shift the threshold voltage of the driving transistor under a third operating condition (or in a third operating phase)) by including at least two selected from a source sync transistor that is electrically connected between a source electrode of the driving transistor and a bottom metal electrode of the driving transistor and is turned on or off in response to a source sync control signal, a gate sync transistor that is electrically connected between a gate electrode of the driving transistor and the bottom metal electrode of the driving transistor and is turned on or off in response to a gate sync control signal, and a constant-voltage sync transistor that is electrically connected between the bottom metal electrode of the driving transistor and a constant-voltage supplying line and is turned on or off in response to a constant-voltage sync control signal.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A pixel circuit, comprising:
an organic light-emitting element;
a switching transistor configured to be turned on or off in response to a scan signal;
a storage capacitor configured to store a data signal applied via a data line when the switching transistor is turned on in response to the scan signal;
a driving transistor configured to allow a driving current corresponding to the data signal stored in the storage capacitor to flow into the organic light-emitting element;
an emission control transistor electrically connected to the organic light-emitting element and the driving transistor in series between a high power voltage and a low power voltage and configured to be turned on or off in response to an emission control signal; and
a plurality of sync transistors directly connected to a bottom metal electrode of the driving transistor,
wherein:
the sync transistors comprise:
a first sync transistor including a first electrode directly connected to a source electrode of the driving transistor, a second electrode directly connected to the bottom metal electrode of the driving transistor, and a gate electrode to which a first sync control signal is applied; and
a second sync transistor including a first electrode directly connected to a gate electrode of the driving transistor, a second electrode directly connected to the bottom metal electrode of the driving transistor, and a gate electrode to which a second sync control signal that is different from the first sync control signal is applied.

2. The pixel circuit of claim 1, wherein:
the second sync transistor is turned off when the first sync transistor is turned on; and
the first sync transistor is turned off when the second sync transistor is turned on.

3. The pixel circuit of claim 1, wherein:
the first sync transistor is a source sync transistor directly connected between the source electrode of the driving transistor and the bottom metal electrode of the driving transistor and configured to be turned on or off in response to the first sync control signal; and
the second sync transistor is a gate sync transistor directly connected between the gate electrode of the driving transistor and the bottom metal electrode of the driving transistor and configured to be turned on or off in response to the second sync control signal.

4. The pixel circuit of claim 3, wherein:
the driving transistor is a p-channel metal oxide semiconductor transistor; and
a threshold voltage of the driving transistor is shifted in a negative direction when the source sync transistor is turned on in response to the first sync control signal.

5. The pixel circuit of claim 3, wherein:
the driving transistor is a p-channel metal oxide semiconductor transistor; and
a threshold voltage of the driving transistor is shifted in a positive direction when the gate sync transistor is turned on in response to the second sync control signal.

6. A pixel circuit, comprising:

an organic light-emitting element;

a switching transistor configured to be turned on or off in response to a scan signal;

a storage capacitor configured to store a data signal applied via a data line when the switching transistor is turned on in response to the scan signal;

a driving transistor configured to allow a driving current corresponding to the data signal stored in the storage capacitor to flow into the organic light-emitting element;

an emission control transistor electrically connected to the organic light-emitting element and the driving transistor in series between a high power voltage and a low power voltage and configured to be turned on or off in response to an emission control signal;

a source sync transistor electrically connected between a source electrode of the driving transistor and a bottom metal electrode of the driving transistor and configured to be turned on or off in response to a source sync control signal; and a gate sync transistor electrically connected between a gate electrode of the driving transistor and the bottom metal electrode of the driving transistor and configured to be turned on or off in response to a gate sync control signal, wherein:

the driving transistor is a p-channel metal oxide semiconductor transistor;

a threshold voltage of the driving transistor is shifted in a negative direction when the source sync transistor is turned on in response to the source sync control signal;

the source sync control signal is activated during a first period when a decrease of the driving current flowing into the organic light-emitting element is required; and the source sync transistor is turned on during the first period to allow a source voltage of the source electrode of the driving transistor to be applied to the bottom metal electrode of the driving transistor.

7. A pixel circuit, comprising:

an organic light-emitting element;

a switching transistor configured to be turned on or off in response to a scan signal;

a storage capacitor configured to store a data signal applied via a data line when the switching transistor is turned on in response to the scan signal;

a driving transistor configured to allow a driving current corresponding to the data signal stored in the storage capacitor to flow into the organic light-emitting element;

an emission control transistor electrically connected to the organic light-emitting element and the driving transistor in series between a high power voltage and a low power voltage and configured to be turned on or off in response to an emission control signal;

a source sync transistor electrically connected between a source electrode of the driving transistor and a bottom metal electrode of the driving transistor and configured to be turned on or off in response to a source sync control signal; and a gate sync transistor electrically connected between a gate electrode of the driving transistor and the bottom metal electrode of the driving transistor and configured to be turned on or off in response to a gate sync control signal, wherein:

the driving transistor is a p-channel metal oxide semiconductor transistor;

a threshold voltage of the driving transistor is shifted in a positive direction when the gate sync transistor is turned on in response to the gate sync control signal;

the gate sync control signal is activated during a second period when an increase of the driving current flowing into the organic light-emitting element is required; and the gate sync transistor is turned on during the second period to allow a gate voltage of the gate electrode of the driving transistor to be applied to the bottom metal electrode of the driving transistor.

* * * * *